US012651723B2

(12) United States Patent
Yoshioka et al.

(10) Patent No.: US 12,651,723 B2
(45) Date of Patent: Jun. 9, 2026

(54) CHARGED PARTICLE BEAM DEVICE AND SAMPLE ANALYSIS METHOD

(71) Applicant: Hitachi High-Tech Corporation, Tokyo (JP)

(72) Inventors: Masayoshi Yoshioka, Tokyo (JP); Naoki Sakamoto, Tokyo (JP); Shinya Kitayama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 335 days.

(21) Appl. No.: 18/284,425

(22) PCT Filed: Apr. 7, 2021

(86) PCT No.: PCT/JP2021/014821
§ 371 (c)(1),
(2) Date: Sep. 27, 2023

(87) PCT Pub. No.: WO2022/215212
PCT Pub. Date: Oct. 13, 2022

(65) Prior Publication Data
US 2024/0170250 A1 May 23, 2024

(51) Int. Cl.
H01J 37/18 (2006.01)
H01J 37/26 (2006.01)

(52) U.S. Cl.
CPC .......... H01J 37/185 (2013.01); H01J 37/261 (2013.01); *H01J 2237/317* (2013.01)

(58) Field of Classification Search
CPC ........ H01J 37/18; H01J 37/185; H01J 37/261; H01J 2237/182; H01J 2237/184; H01J 2237/317
See application file for complete search history.

(56) References Cited

U.S. PATENT DOCUMENTS

2018/0082819 A1    3/2018   Ebine et al.

FOREIGN PATENT DOCUMENTS

| JP | 2000-195460 A | 7/2000 | |
| WO | WO 2016/166825 A1 | 10/2016 | |
| WO | WO-2018020649 A1 * | 2/2018 | .............. H01J 37/20 |

OTHER PUBLICATIONS

International Search Report (PCT/ISA/210) issued in PCT Application No. PCT/JP2021/014821 dated Jul. 6, 2021 with English translation (6 pages).

(Continued)

*Primary Examiner* — David E Smith
(74) *Attorney, Agent, or Firm* — Crowell & Moring LLP

(57) ABSTRACT

A charged particle beam device 1 includes analysis means performed by a controller when a sample holder HL holding a sample SAM is installed on a stage 23. The analysis means includes a step (a) of raising a degree of vacuum of each of an observation chamber 10 and a preprocessing chamber 20 by opening a gate valve VL5, opening a valve VL1, closing a valve VL2, and driving a vacuum pump 40, a step (b) of closing the gate valve VL5 and opening the valve VL2 after the step (a), and a step (c) of processing the sample SAM by radiating an ion beam from an ion source 22 to the sample SAM while performing vacuum exhaust of the preprocessing chamber 20 by the vacuum pump 40 after the step (b). The analysis means can process the sample SAM quickly after performing the vacuum exhaust of the preprocessing chamber 20 in a short time.

13 Claims, 5 Drawing Sheets

(56)    References Cited

OTHER PUBLICATIONS

Japanese-language Written Opinion (PCT/ISA/237) issued in PCT
Application No. PCT/JP2021/014821 dated Jul. 6, 2021 with English translation (7 pages).

* cited by examiner

[FIG. 1]
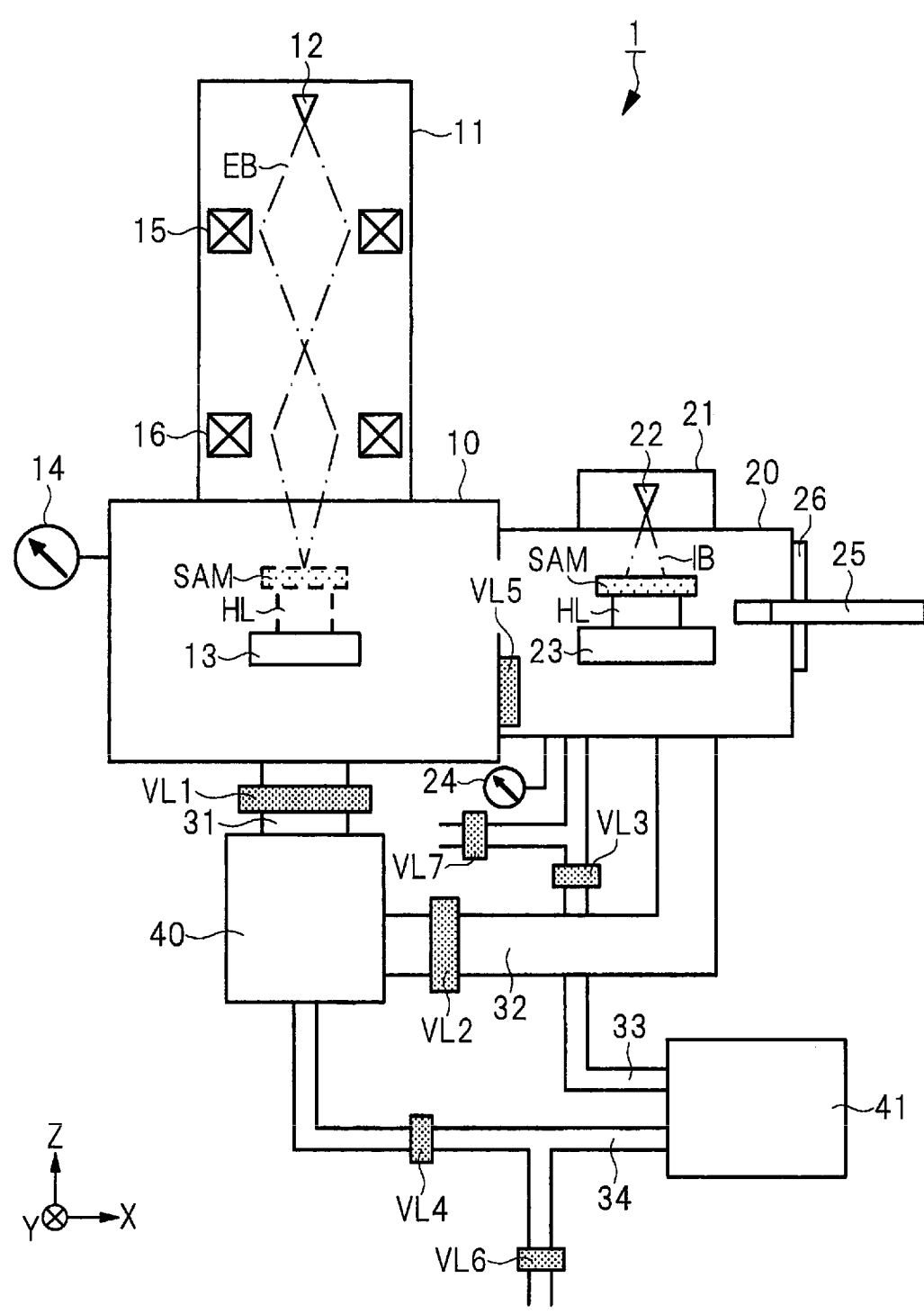

[FIG. 2]
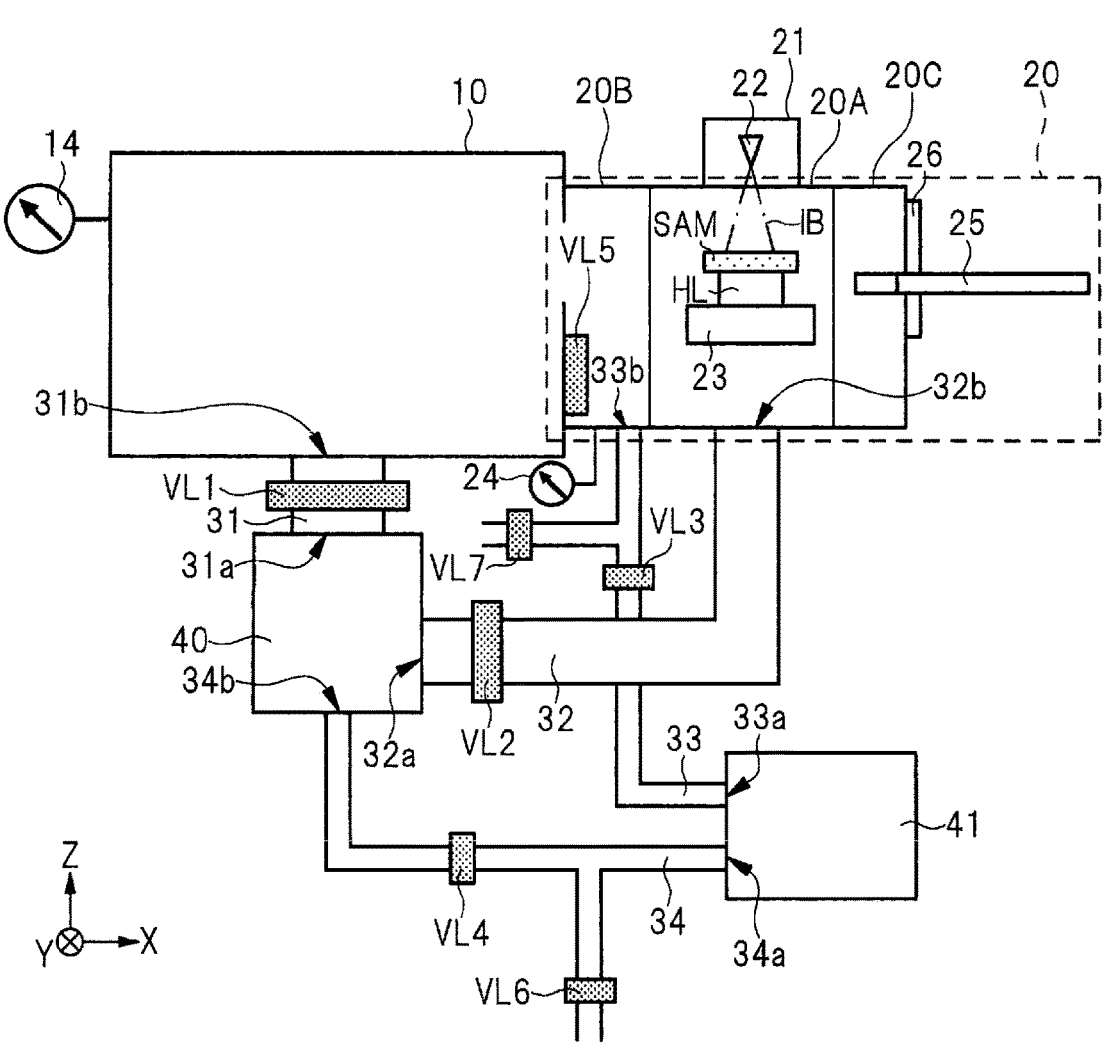

[FIG. 3]
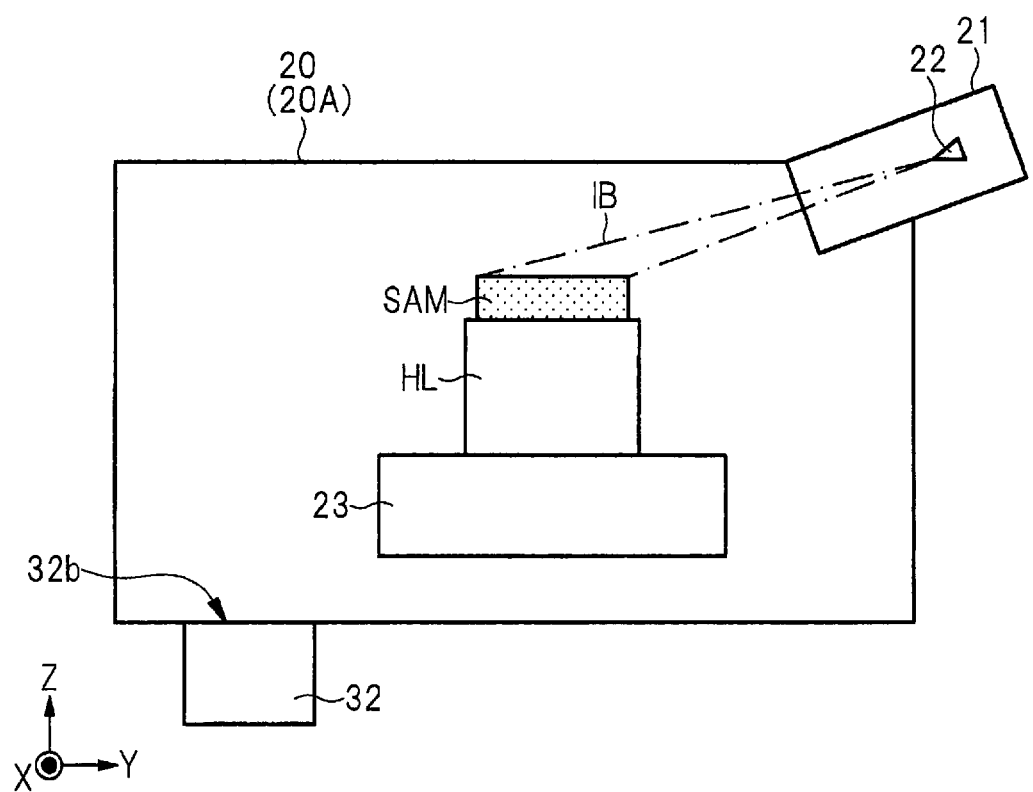

[FIG 4]
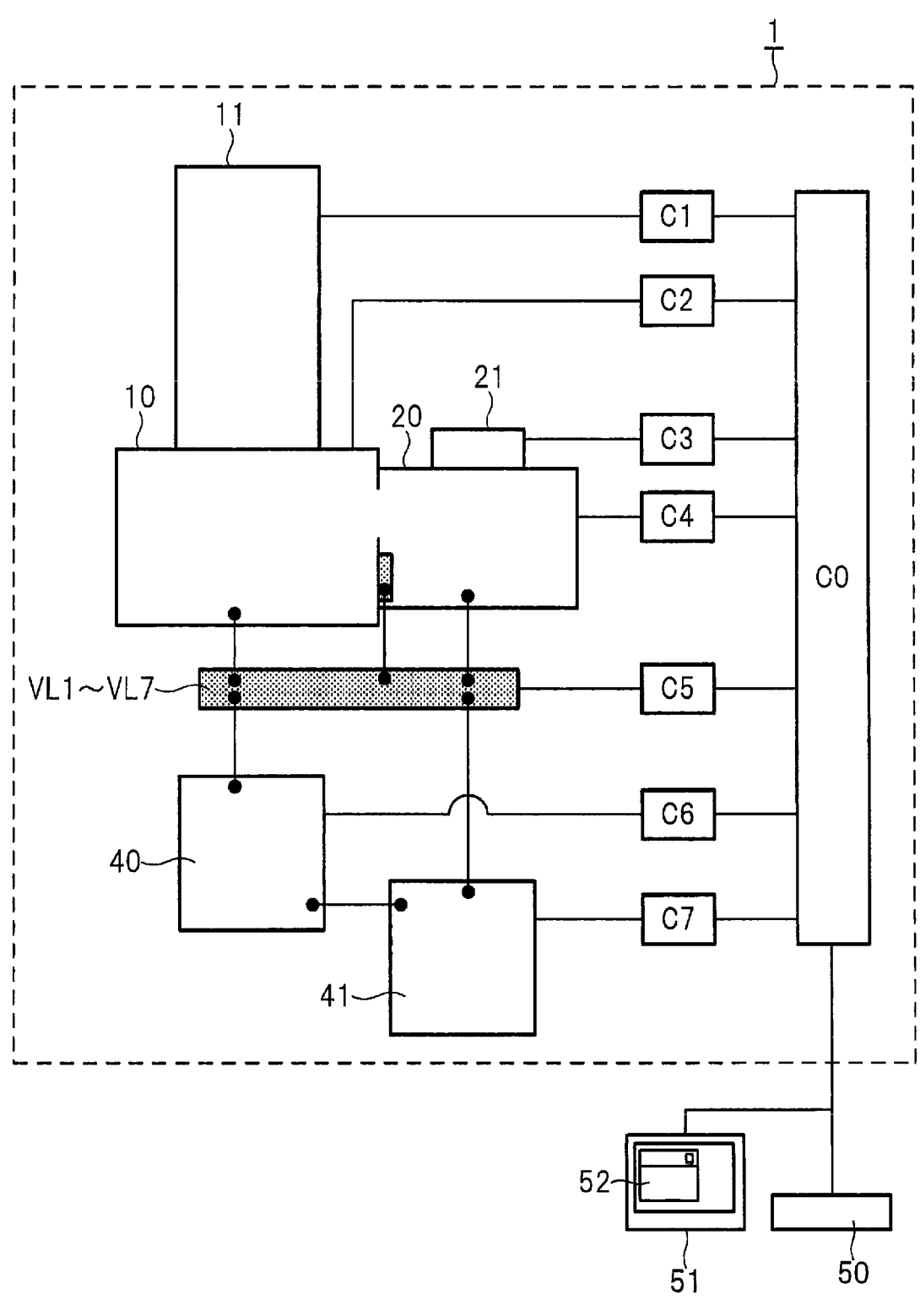

[FIG. 5]

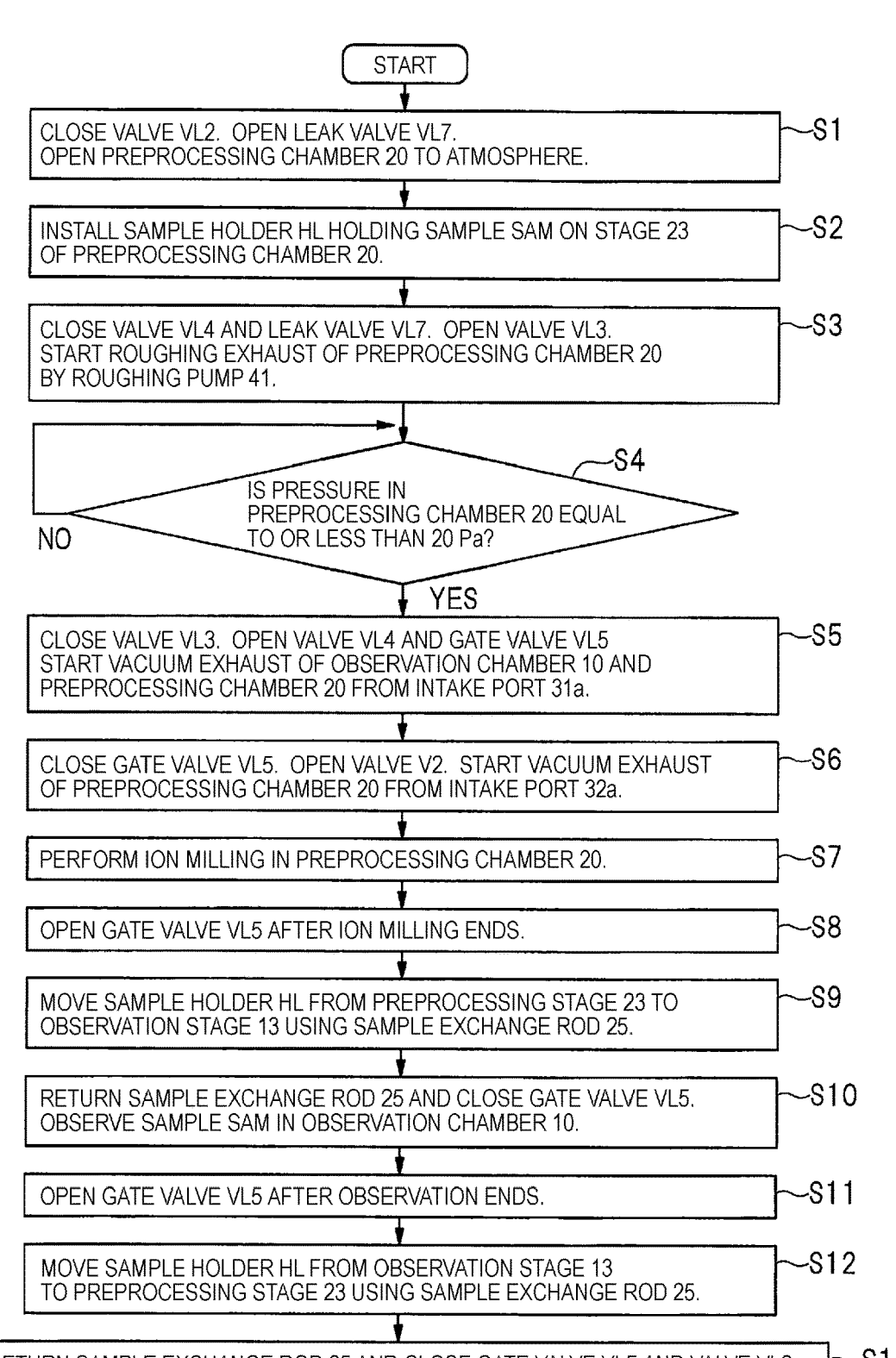

START

CLOSE VALVE VL2. OPEN LEAK VALVE VL7.
OPEN PREPROCESSING CHAMBER 20 TO ATMOSPHERE. — S1

INSTALL SAMPLE HOLDER HL HOLDING SAMPLE SAM ON STAGE 23
OF PREPROCESSING CHAMBER 20. — S2

CLOSE VALVE VL4 AND LEAK VALVE VL7. OPEN VALVE VL3.
START ROUGHING EXHAUST OF PREPROCESSING CHAMBER 20
BY ROUGHING PUMP 41. — S3

IS PRESSURE IN
PREPROCESSING CHAMBER 20 EQUAL
TO OR LESS THAN 20 Pa? — S4

NO

YES

CLOSE VALVE VL3. OPEN VALVE VL4 AND GATE VALVE VL5
START VACUUM EXHAUST OF OBSERVATION CHAMBER 10 AND
PREPROCESSING CHAMBER 20 FROM INTAKE PORT 31a. — S5

CLOSE GATE VALVE VL5. OPEN VALVE V2. START VACUUM EXHAUST
OF PREPROCESSING CHAMBER 20 FROM INTAKE PORT 32a. — S6

PERFORM ION MILLING IN PREPROCESSING CHAMBER 20. — S7

OPEN GATE VALVE VL5 AFTER ION MILLING ENDS. — S8

MOVE SAMPLE HOLDER HL FROM PREPROCESSING STAGE 23 TO
OBSERVATION STAGE 13 USING SAMPLE EXCHANGE ROD 25. — S9

RETURN SAMPLE EXCHANGE ROD 25 AND CLOSE GATE VALVE VL5.
OBSERVE SAMPLE SAM IN OBSERVATION CHAMBER 10. — S10

OPEN GATE VALVE VL5 AFTER OBSERVATION ENDS. — S11

MOVE SAMPLE HOLDER HL FROM OBSERVATION STAGE 13
TO PREPROCESSING STAGE 23 USING SAMPLE EXCHANGE ROD 25. — S12

RETURN SAMPLE EXCHANGE ROD 25 AND CLOSE GATE VALVE VL5 AND VALVE VL2.
OPEN LEAK VALVE VL7 AND OPEN PREPROCESSING CHAMBER 20 TO ATMOSPHERE. — S13

END

CHARGED PARTICLE BEAM DEVICE AND SAMPLE ANALYSIS METHOD

TECHNICAL FIELD

The present invention relates to a charged particle beam device and a sample analysis method, and more particularly, to a charged particle beam device including an observation chamber and a preprocessing chamber and a sample analysis method performed using the charged particle beam device.

BACKGROUND ART

In recent years, miniaturization of semiconductor devices has been in progress. In particular, high integration and high capacity of semiconductor devices that have 3-dimensional structures are rapidly in progress by combination with a stacking technology. As charged particle beam devices analyzing such semiconductor devices, a scanning electron microscope (SEM), a transmission electron microscope (TEM), a scanning transmission electron microscope (STEM), and the like are used.

On the other hand, planar sample producing methods using ion beams (ion milling) are generally used. A planar milling method is a scheme of processing a broad range by radiating, for example, an argon ion beam obliquely to the surface of a sample and causing a center of the argon ion beam to be eccentric to a center of sample rotation. When a radiation angle of an ion beam is approached to a processing surface of a sample in parallel, a processing surface on which an unevenness portion caused due to an etching rate difference of composition or crystal orientation is reduced can be formed. When the radiation angle of the ion beam is approached to the processing surface of the sample vertically, processing in which an unevenness portion is enhanced can be performed by using an etching rate difference.

For example, in PTL 1, an observation chamber of a charged particle beam device is connected to a preprocessing chamber for ion milling via a valve. PTL 1 discloses a technology for performing ion milling on a sample by vacuum-exhausting the preprocessing chamber up to a predetermined degree of vacuum using a vacuum pump in a state where the valve is closed.

PTL 2 discloses a charged particle beam device that includes an observation chamber for SEM observation and a preprocessing chamber for ion milling connected to the observation chamber via a valve. Further, the observation chamber and the preprocessing chamber are vacuum-exhausted by connecting a vacuum pump corresponding to a rotary pump to a vacuum pump corresponding to a turbomolecular pump as a tandem structure and connecting two intake ports of the turbomolecular pump to the observation chamber and the preprocessing chamber.

CITATION LIST

Patent Literature

PTL 1: JP2000-195460A
PTL 2: WO2018/020649A

SUMMARY OF INVENTION

Technical Problem

The present inventors of the present specification have conducted examination and have found out that the degree of vacuum required for preprocessing cannot be satisfied through only vacuum exhaust by a roughing pump when the preprocessing such as ion milling in which a high-vacuum environment is required is performed inside a charged particle beam device. Further, in latest semiconductor markets, an improvement in a throughput is required. Therefore, it is necessary to shorten a time in which the degree of vacuum required for preprocessing is attained. Accordingly, the present inventors of the present specification have examined a charged particle beam device in which an observation chamber for SEM observation and a preprocessing chamber for ion milling are each separated and the observation chamber is connected to the preprocessing chamber.

In the technology disclosed in PTL 1, a vacuum pump different from that of the observation chamber for SEM observation is required in the preprocessing chamber. Therefore, it is necessary to newly install a vacuum pump, and thus an increase in an installation location, an increase in installation cost, and vibration generated in vacuum exhaust become problems.

In PTL 2, a specific sequence of vacuum exhaust of the observation chamber and the preprocessing chamber is not clearly described, and it is likely to take much time for vacuum exhaust of the preprocessing chamber.

A main object of the present specification is to provide a charged particle beam device in which a connection relation among an observation chamber, a preprocessing chamber, and a vacuum pump is simplified. Another object of the present invention is to provide an analysis method (analysis means) of performing vacuum exhaust of the preprocessing chamber in a short time using the charged particle beam device. Other problems and novel characteristics will be clear from the description of the present specification and the appended drawings.

Solution to Problem

An outline of a representative embodiment of disclosed embodiments of the present specification will be described simply as follows.

According to an embodiment, a charged particle beam device includes: an observation chamber including a first exhaust port; a first body tube mounted on the observation chamber; a first charged particle source provided inside the first body tube and capable of radiating a first charged particle beam; a first stage which is provided below the first charged particle source inside the observation chamber and in which a sample holder holding a sample is installable; a preprocessing chamber connected to the observation chamber via a gate valve and including a second exhaust port; a second body tube mounted on the preprocessing chamber; a second charged particle source provided inside the second body tube and capable of radiating a second charged particle beam; a second stage which is provided below the second charged particle source inside the preprocessing chamber and in which the sample holder holding the sample is installable; a first vacuum pump including a first intake port and a second intake port; a first exhaust pipe connected to the first intake port and the first exhaust port; a second exhaust pipe connected to the second intake port and the second exhaust port; a first valve provided halfway in the first exhaust pipe; a second valve provided halfway in the second exhaust pipe; a controller configured to control an operation of each of the first charged particle source, the first stage, the second charged particle source, and the second stage, control driving of the first vacuum pump, and control open and closed states of the gate valve, the first valve, and the second valve; and analysis means performed by the controller when the sample holder holding the sample is installed on the second stage. A caliber of each of the first intake port and the first exhaust port is larger than a caliber of each of the second intake port and the second exhaust port. The analysis means includes a step (a) of raising a degree of vacuum of each of the observation chamber and the preprocessing chamber by opening the gate valve, opening the first valve, closing the second valve, and driving the first vacuum pump, a step (b) of closing the gate valve and opening the second valve after the step (a), and a step (c) of processing the sample by radiating the second charged particle beam from the second charged particle source to the sample while performing vacuum exhaust of the preprocessing chamber by the first vacuum pump after the step (b).

According to another embodiment, a charged particle beam device includes: an observation chamber; a first body tube mounted on the observation chamber; a first charged particle source provided inside the first body tube and capable of radiating a first charged particle beam; a first stage which is provided below the first charged particle source inside the observation chamber and in which a sample holder holding a sample is installable; a preprocessing chamber connected to the observation chamber via a gate valve; and a sample exchange rod provided inside the preprocessing chamber and used to move the sample holder between the observation chamber and the preprocessing chamber. The preprocessing chamber includes a second unit and a third unit that are detachably mountable each other. In the second unit, the gate valve is provided. In the third unit, the sample exchange rod is provided.

According to still another embodiment, a sample analysis method is performed using a charged particle beam device including: an observation chamber including a first exhaust port; a first body tube mounted on the observation chamber; a first charged particle source provided inside the first body tube and capable of radiating a first charged particle beam; a first stage which is provided below the first charged particle source inside the observation chamber and in which a sample holder holding a sample is installable; a preprocessing chamber connected to the observation chamber via a gate valve and including a second exhaust port and a third exhaust port; a second body tube mounted on the preprocessing chamber; a second charged particle source provided inside the second body tube and capable of radiating a second charged particle beam; a second stage which is provided below the second charged particle source inside the preprocessing chamber and in which the sample holder holding the sample is installable; a sample exchange rod provided inside the preprocessing chamber and used to move the sample holder between the observation chamber and the preprocessing chamber; a first vacuum pump including a first intake port and a second intake port; a second vacuum pump including a third intake port and having an attainable degree of vacuum lower than the first vacuum pump; a first exhaust pipe connected to the first intake port and the first exhaust port; a second exhaust pipe connected to the second intake port and the second exhaust port; a third exhaust pipe connected to the third intake port and the third exhaust port; a first valve provided halfway in the first exhaust pipe; a second valve provided halfway in the second exhaust pipe; and a third valve provided halfway in the third exhaust pipe. The sample analysis method includes: a step (a) of installing the sample holder holding the sample on the second stage; a step (b) of raising the degree of vacuum of each of the observation chamber and the preprocessing chamber by closing the gate valve, opening the first valve, closing the second valve, opening the third valve, and driving the second vacuum pump after the step (a); a step (c) of causing the degree of vacuum of the preprocessing chamber to be greater than the degree of vacuum in the step (b) by opening the gate valve, closing the third valve, and driving the first vacuum pump after the step (b); a step (d) of closing the gate valve and opening the second valve after the step (c); a step (e) of processing the sample by radiating the second charged particle beam from the second charged particle source to the sample while performing vacuum exhaust of the preprocessing chamber by the first vacuum pump after the step (d); a step (f) of opening the gate valve after the step (e); a step (g) of moving the sample holder holding the sample from the second stage to the first stage using the sample exchange rod after the step (f); a step (h) of closing the gate valve after the step (g); and a step (i) of observing the sample by radiating the first charged particle beam from the first charged particle source to the sample while performing vacuum exhaust of the observation chamber by the first vacuum pump after the step (h). Here, a caliber of each of the first intake port and the first exhaust port is larger than a caliber of each of the second intake port and the second exhaust port.

Advantageous Effects of Invention

According to an embodiment, it is possible to provide a charged particle beam device in which a connection relation among an observation chamber, a preprocessing chamber, and a vacuum pump is simplified. It is also possible to provide an analysis method (analysis means) of performing vacuum exhaust of the preprocessing chamber in a short time using the charged particle beam device.

BRIEF DESCRIPTION OF DRAWINGS

FIG. 1 is a schematic view illustrating a charged particle beam device according to a first embodiment.

FIG. 2 is a schematic view illustrating partially enlarged main units of the charged particle beam device according to the first embodiment.

FIG. 3 is a side view illustrating a first unit of a preprocessing chamber according to the first embodiment.

FIG. 4 is a schematic view illustrating a system configuration of the charged particle beam device according to the first embodiment.

FIG. 5 is a flowchart illustrating a sample analysis method (analysis means) according to the first embodiment.

DESCRIPTION OF EMBODIMENTS

Hereinafter, embodiments will be described in detail with reference to the drawings. In all the drawings for describing the embodiments, members that have the same functions are denoted by the same reference numerals and repeated description thereof will be omitted. In the following embodiments, the same or similar portions will not be repeatedly described unless particularly necessary.

The X, Y, and Z directions described in the present specification intersect each other and are orthogonal to each other. In the present specification, the Z direction will be described as a vertical direction, a height direction, or a thickness direction of a structure.

First Embodiment

<Configuration of Charged Particle Beam Device 1>

Hereinafter, a charged particle beam device 1 according to the first embodiment will be described with reference to FIGS. 1 to 3. In the first embodiment, a scanning electron microscope (SEM) will be exemplified as the charged particle beam device 1.

As illustrated in FIG. 1, the charged particle beam device 1 includes an observation chamber 10, a body tube 11 mounted on the observation chamber 10, a preprocessing chamber 20, and a body tube 21 mounted on the preprocessing chamber 20. The charged particle beam device 1 includes a vacuum gauge 14 that measures a degree of vacuum inside the observation chamber 10 and a vacuum gauge 24 that measures a degree of vacuum inside the preprocessing chamber 20.

Inside the body tube 11, an electron source (charged particle source) 12 capable of radiating an electron beam (charged particle beam) EB, a condenser lens 15 that focuses the electron beam EB, an objective lens 16, and the like are provided. A stage 13 on which a sample holder HL holding a sample SAM can be installed is provided inside the observation chamber 10 below the electron source 12.

Although not illustrated in FIG. 1, an electron optical system formed by the condenser lens 15, the objective lens 16, a deflection lens, a scanning lens, and the like and a vacuum pump (corresponding to an ion pump) that highly vacuumizes the inside of the body tube 11 are provided in the body tube 11. A detector that detects secondary electrons or the like and an image processing unit that converts signals of the secondary electrons or the like into image data are provided in the observation chamber 10.

When the electron beam EB is radiated from the electron source 12 to the sample SAM on the stage 13 during observation of the sample SAM, signal electrons such as secondary electrons are generated by interaction between the electron beam EB and a minute pattern formed on the sample SAM. The generated signal electrons are detected by the detector and are converted into the image data by the image processing unit. The sample SAM can be observed with the image data.

An ion source (charged particle source) 22 capable of radiating an ion beam (charged particle beam) IB and the like are provided inside the body tube 21. A stage 23 on which the sample holder HL holding the sample SAM can be installed is provided inside the preprocessing chamber 20 below the ion source 22. Inside the preprocessing chamber 20, a sample exchange rod 25 used to move the sample holder HL between the observation chamber 10 and the preprocessing chamber 20 is provided. In the preprocessing chamber 20, a conveyance port 26 is provided. By opening the conveyance port 26, the sample holder HL holding the sample SAM can be conveyed from the outside to the inside of the preprocessing chamber 20 or from the inside to the outside of the preprocessing chamber 20.

In the preprocessing chamber 20, preprocessing for ion milling is performed. When the sample SAM is processed, the ion beam IB is radiated from the ion beam 22 to the sample SAM on the stage 23 to process the sample SAM and a milling surface is obtained.

As illustrated in FIG. 3, the body tube 21 is mounted to be tilted in the preprocessing chamber 20 so that the ion beam IB is tilted and radiated with respect to a rotation axis of the sample SAM. The stage 23 includes at least a rotational mechanism. A uniform plane is formed on the sample SAM by the ion milling by radiating the ion beam IB to the sample SAM while rotating the stage 23.

By driving the body tube 21 in the Y direction by an externally attached movement mechanism, it is possible to cause a rotational center of the sample SAM to be eccentric to a center of the ion beam. Accordingly, it is possible to broaden a processing range and have the degree of freedom of processing. The same applies to a case where the stage 23 has a movement axis in the Y direction. When the stage 23 is driven in the Y direction, the sample holder HL deviates from a movement axis of the sample exchange rod 25. Therefore, when the sample holder HL is moved from the preprocessing chamber 20 to the observation chamber 10, It is necessary to mount a safety mechanism returning an eccentric mechanism to an initial state.

In the charged particle beam device 1 according to the first embodiment, the observation chamber 10 for SEM observation and the preprocessing chamber 20 for ion milling are connected via a gate valve VL5 in order to improve a throughput for processing and observation of the sample SAM.

To open the gate valve VL5, the gate valve VL5 is moved in the lower direction of the drawing. When the gate valve VL5 is in the open state, the inside of the observation chamber 10 and the inside of the preprocessing chamber 20 are connected physically as the same space. Accordingly, the sample exchange rod 25 on which the sample holder HL is mounted can be moved between the observation chamber 10 and the preprocessing chamber 20.

To close the gate valve VL5, the gate valve VL5 is moved in the upper direction of the drawing. When the gate valve VL5 is in the closed state, the inside of the observation chamber 10 and the inside of the preprocessing chamber 20 are separated physically by the gate valve VL5. Accordingly, it is possible to observe the sample SAM independently inside the observation chamber 10 and process the sample SAM independently inside the preprocessing chamber 20.

FIG. 2 illustrates a peripheral structure of each of the observation chamber 10, the preprocessing chamber 20, and a vacuum pump in the charged particle beam device 1 in FIG. 1.

In the first embodiment, an expression such as "increasing the degree of vacuum" and "highly vacuumizing" means that "pressure is lowered", and "decreasing the degree of vacuum" and "lowly vacuumizing" means that "pressure is raised". The atmospheric pressure is 103525 Pa, and an expression such as "opening to the atmosphere" means that "a pressure of the space is exposed to the atmospheric pressure".

As illustrated in FIG. 2, the charged particle beam device 1 includes a high vacuum pump (vacuum pump) 40 and a roughing pump (vacuum pump) 41. The high vacuum pump 40 is, for example, a turbomolecular pump and includes an intake port 31a as a main intake port and an exhaust port 32a. The roughing pump 41 is, for example, a dry pump.

The high vacuum pump 40 can attain the degree of vacuum of, for example, $10^{-2}$ to $10^{-5}$ Pa. The degree of vacuum which can be attained by the roughing pump 41 is lower than that of the high vacuum pump 40 and is, for example, about a few Pa to 100 Pa.

An exhaust pipe 31 is connected to the intake port 31a of the high vacuum pump 40 and an exhaust port 31b of the observation chamber 10. An exhaust pipe 32 is connected to the intake port 32a of the high vacuum pump 40 and an exhaust port 32b of the preprocessing chamber 20.

A caliber of each of the intake port 31a and the exhaust port 31b is greater than a caliber of each of the intake port 32a and the exhaust port 32b. Therefore, an exhaust speed of the exhaust pipe 31 is faster than an exhaust speed of the exhaust pipe 32. Accordingly, when the high vacuum pump 40 is driven, the degree of vacuum of the preprocessing chamber 20 becomes temporarily lower than the degree of vacuum of the observation chamber 10. In other words, in the high vacuum pump 40, the intake port 31a is relatively in the higher degree of vacuum and the intake port 32a has the degree of vacuum lower than that of the intake port 31a.

An exhaust pipe 33 is connected to an intake port 33a of the roughing pump 41 and an exhaust port 33b of the preprocessing chamber 20. An exhaust pipe 34 is connected to an intake port 34a of the roughing pump 41 and an exhaust port 34b of the high vacuum pump 40.

A valve VL1 is provided halfway in the exhaust pipe 31. A valve VL2 is provided halfway in the exhaust pipe 32. A valve VL3 is provided halfway in the exhaust pipe 33. A valve VL4 is provided halfway in the exhaust pipe 34. An exhaust operation performed via the exhaust pipes 31 to 34 is controlled by operating open and closed states of the valves VL1 to VL4.

A leak valve VL6 is provided halfway in the exhaust pipe 34 and between the roughing pump 41 and the valve VL4. A leak valve VL7 is provided halfway in the exhaust pipe 33 and between the preprocessing chamber 20 and the valve VL3. A back pressure side of the high vacuum pump 40 is opened to the atmosphere by opening the leak valve VL6. The inside of the preprocessing chamber 20 is opened to the atmosphere by opening the leak valve VL7.

FIG. 4 is a schematic view illustrating a system configuration of the charged particle beam device 1. As illustrated in FIG. 4, the charged particle beam device 1 includes a controller C0 and control units C1 to C7.

The control units C1 to C4 respectively control operations of configurations included in the body tube 11, the observation chamber 10, the body tube 21, and the preprocessing chamber 20. That is, the control unit C1 controls operation of the electron source 12, the condenser lens 15, the objective lens 16, and the like. The control unit C2 controls operations of the stage 13, the vacuum gauge 14, and the like. The control unit C3 controls operations of the ion source 22 and the like. The control unit C4 controls operations of the stage 23, the vacuum gauge 24, and the like. A user performs an operation of moving the sample exchange rod 25 and an operation of opening or closing the conveyance port 26.

The control unit C5 controls open and closed states of the valves VL1 to VL4, the gate valve VL5, the leak valve VL6, and the leak valve VL7. The control unit C6 controls driving of the high vacuum pump 40 and the control unit C7 controls driving of the roughing pump 41.

The controller C0 can communicate with each of the control units C1 to C7 and controls the entire charged particle beam device 1 in accordance with an instruction from the user using an input device 50 and under a preset condition. The controller C0 includes a storage unit (not illustrated) that stores information or the like acquired from the control units C1 to C7.

The controller C0 generally controls the control units C1 to C7. Accordingly, in the first embodiment, the controller C0 and the control units C1 to C7 can be regarded as one unit, and control performed by the control units C1 to C7 can be regarded as control of the controller C0.

The input device 50 is, for example, a device with which a user inputs various instructions for an input of analysis target information, a change in a radiation condition of the electron beam EB and the ion beam IB, a change in a stage position, and the like. Control for an open and closed state of the gate valve VL5 can be performed by the user using the input device 50. The input device 50 is, for example, a keyboard, a mouse, or the like. A GUI screen 52 or the like is displayed on a monitor 51. The user can input the foregoing instruction through the GUI screen 52 on the input device 50, and the instruction is transmitted to the controller C0.

The input device 50 and the monitor 51 may be provided inside the charged particle beam device 1 or may be provided outside of the charged particle beam device 1 as an external device.

Incidentally, as illustrated in FIG. 2, the preprocessing chamber 20 is partitioned into a plurality of units as a first unit 20A, a second unit 20B, and a third unit 20C that are detachably mountable each other.

The first unit 20A has an ion milling function and includes the body tube 21, an ion source 22, a stage 23, and an exhaust port 32b connected to the high vacuum pump 40. The second unit 20B includes the gate valve VL5 and an exhaust port 33b connected to the roughing pump 41. The third unit 20C includes the sample exchange rod 25 and the conveyance port 26.

In FIG. 2, the exhaust port 33b is included in the second unit 20B. The exhaust port 33b may be included in the first unit 20A or the third unit 20C.

Since the first unit 20A to the third unit 20C are detachably mountable each other, functions required in the preprocessing chamber 20 can be changed. The first unit 20A has the ion milling function. However, instead of the first unit 20A, for example, another unit that has a focused ion beam (FIB) function or the like may be prepared, and the preprocessing chamber 20 can also include the other unit, the second unit 20B, and the third unit 20C. Only the second unit 20B and the third unit 20C are included in the preprocessing chamber 20 without applying the first unit 20A, so that the preprocessing chamber 20 can serve as a simply sample exchange chamber.

In this way, in the charged particle beam device 1 according to the first embodiment, a plurality of units can be recombined depending on work desired to be performed in the preprocessing chamber 20.

<Analysis Method for Sample SAM (Analysis Means)>

As described above, in order to perform ion milling on the sample SAM, it is necessary to efficiently radiate the ion beam IB to the surface of the sample SAM. Therefore, it is desirable to adjust the degree of vacuum of the preprocessing chamber 20 in which ion milling is performed to a high degree of vacuum and adjust the degree of vacuum in a short time so that an average free process of the ion beam IB is sufficiently long.

However, when the ion milling is performed in an open state of the valve VL1 to obtain a high degree of vacuum, there is a problem that the observation chamber 10 is contaminated due to sputtered particles generated in the ion milling. Further, an Ar gas generated from the ion source 22 of the ion milling is a cause of deterioration in a SEM function.

Hereinafter, an analysis method of solving this problem and performing the vacuum exhaust of the preprocessing chamber in a short time will be described. The analysis method is performed using the charged particle beam device 1. When the sample holder HL holding the sample SAM is installed on the stage 23 in the following step S2, the following steps S3 to S13 are performed by the controller C0 except for an operation of the sample exchange rod 25 by the user. Accordingly, the charged particle beam device 1 can also be said to include the analysis means (the following steps S3 to S13) performed generally by the controller C0 although some of operations by the user are included.

FIG. 5 is a flowchart illustrating an analysis method for the sample SAM according to the first embodiment.

First, in "Start" of FIG. 5, the sample holder HL holding the sample SAM is prepared. For example, in another device different from the charged particle beam device 1, the sample SAM is generated and the sample SAM is mounted on the sample holder HL. Thereafter, the subsequent steps S1 to 13 are performed.

The sample SAM is a foil acquired in advance by processing a part of a wafer by, for example, an FIB device. The semiconductor wafer includes a semiconductor substrate in which p-type or n-type impurity regions are formed, semiconductor elements such as transistors formed on the semiconductor substrate, and wiring layers formed on the semiconductor elements. Accordingly, the sample SAM includes some or all of the semiconductor substrate, the semiconductor elements, and the wiring layers. The sample SAM is not limited to a part of the semiconductor wafer and may be a structure used in a technology other than a semiconductor technology.

In step S1, the control unit C5 closes the gate valve VL5, the valve VL2, the valve VL3, and the leak valve VL6 and opens the valve VL1, the valve VL4, and the leak valve VL7. The control unit C6 drives the high vacuum pump 40. Accordingly, the observation chamber 10 is maintained in a high degree of vacuum and the preprocessing chamber 20 is opened to the atmosphere.

In step S2, the sample holder HL holding the sample SAM is installed on the stage 23 of the preprocessing chamber 20. When the pressure of the preprocessing chamber 20 becomes the same as the atmospheric pressure, the conveyance port 26 of the third unit 20C is opened and the sample holder HL holding the sample SAM can be switched via the conveyance port 26.

In step S3, the control unit C5 closes the valve VL4 and the leak valve VL7 and opens the valve VL3. Then, the control unit C7 drives the roughing pump 41 and starts roughing exhaust of the preprocessing chamber 20 to raise the degree of vacuum of the preprocessing chamber 20. At this time, by closing the valve VL4, it is possible to prevent worsening of the back pressure of the high vacuum pump 40.

In step S4, the vacuum gauge 24 and the control unit C4 determine whether a pressure in the preprocessing chamber 20 is equal to or less than 20 Pa. When the pressure is equal to or less than 20 Pa (YES), a subsequent step is step S5. When the pressure is greater than 20 Pa (NO), the roughing exhaust from the roughing pump 41 continues until the pressure in the preprocessing chamber 20 becomes 20 Pa or less.

Here, a determination value of the pressure after the roughing exhaust is set to 20 Pa. However, the determination value of the pressure is not limited to 20 Pa and a pressure of the preprocessing chamber 20 only needs to be lower than a permissible load value of the high vacuum pump 40.

The degree of vacuum which can be attained by the high vacuum pump 40 is higher than that of the roughing pump 41, the roughing pump 41 has a higher approximate value than the high vacuum pump 40 in that exhaust is performed so as to attain a pressure of about a few Pa to 100 Pa from the atmospheric pressure. Accordingly, when the pressure is changed to about a few Pa to 100 Pa from the atmospheric pressure, the roughing pump 41 is used. When the pressure is changed to about $10^{-2}$ to $10^{-5}$ Pa from the pressure of a few Pa to 100 Pa, the high vacuum pump 40 is used. Accordingly, it is possible to shorten a total exhaust time.

In step S5, the control unit C5 closes the valve VL3 and opens the valve VL4 and the gate valve VL5. After the roughing exhaust is performed on the preprocessing chamber 20, vacuum exhaust is started on both the observation chamber 10 and the preprocessing chamber 20 from the intake port 31a of the high vacuum pump 40 via the exhaust pipe 31 and the exhaust port 31b. Accordingly, the degree of vacuum of the preprocessing chamber 20 is the degree of vacuum higher than the degree of vacuum of step S3 (step S4).

Here, it is desirable to wait until the pressure of the observation chamber 10 becomes $10^{-3}$ Pa order, and to wait until the pressures of the observation chamber 10 and the preprocessing chamber 20 become subsequently the same. The $10^{-3}$ Pa order is exemplary, it may be waited until the pressure of the observation chamber 10 is further lowered.

Here, when a high vacuum pump that includes only one intake port is used and the observation chamber 10 and the preprocessing chamber 20 are simultaneously vacuum-exhausted, a reverse flow of gas molecules from the preprocessing chamber 20 to the observation chamber 10 occurs. In the first embodiment, however, since the intake ports 31a and 32a are provided in the high vacuum pump 40, it is possible to prevent a reverse flow of the gas molecules.

In step S5, the observation chamber 10 and the preprocessing chamber 20 are vacuum-exhausted via the intake port 31a with a relatively large caliber. Accordingly, it is possible to shorten a time of the vacuum exhaust compared with a case where the vacuum exhaust is performed via the intake port 32a with a relatively small caliber.

In step S6, the control unit C5 closes the gate valve VL5 and opens the valve VL2. The preprocessing chamber 20 is vacuum-exhausted from the intake port 32a of the high vacuum pump 40.

When the gate valve VL5 is closed, a pump that vacuum-exhausts the preprocessing chamber 20 disappears. The degree of vacuum of the preprocessing chamber 20 is worse than the observation chamber 10. When an exhaust speed of the intake port 31a is compared with an exhaust speed of the intake port 32a, the exhaust speed of the intake port 31a is faster than the exhaust speed of the intake port 32a. Therefore, since the degree of vacuum of the preprocessing chamber 20 is temporarily worse than that of the observation chamber 10, it is necessary to open the valve VL2 immediately after the gate valve VL5 is closed.

After the roughing exhaust of step S3 (step S4) is completed, it is conceivable that the preprocessing chamber 20 is vacuum-exhausted from the intake port 32a while maintaining the closed state of the gate valve VL5 and opening the valve VL2.

However, when the preprocessing chamber 20 is vacuum-exhausted from the intake port 32a as in step S6 in a state where the degree of vacuum of the preprocessing chamber 20 is raised using the intake port 31a with a fast exhaust speed as in step S5, it is possible to shorten a total time until the degree of vacuum required to start the ion milling is attained.

In step S7, the ion milling is performed on the sample SAM in the preprocessing chamber 20. That is, by causing the control unit C3 to radiate the ion beam IB from the ion source 22 to the sample SAM while the high vacuum pump 40 vacuum-exhausts the preprocessing chamber 20, the sample SAM is processed.

During the ion milling, the gate valve VL5 is in the closed state. Accordingly, it is possible to solve the problem that the observation chamber 10 is contaminated due to sputtered particles generated in the ion milling and the problem that the Ar gas generated from the ion source 22 causes deterioration in the SEM function.

In step S8, after the ion milling ends, the control unit C5 opens the gate valve VL5.

In step S9, the user inserts the sample exchange rod 25 into the sample holder HL holding the sample SAM and moves the sample holder HL from the stage 23 of the preprocessing chamber 20 to the stage 13 of the observation chamber 10.

In step S10, after the movement of the sample holder HL is completed, the control unit C4 returns the sample exchange rod 25 to an initial position and the control unit C5 closes the gate valve VL5. Thereafter, by causing the control unit C1 to radiate the electron beam EB from the electron source 12 to the sample SAM while the high vacuum pump 40 vacuum-exhausts the observation chamber 10, the sample SAM is observed.

In step S11, after the observation of the sample SAM ends, the control unit C5 opens the gate valve VL5.

In step S12, the user inserts the sample exchange rod 25 into the sample holder HL holding the sample SAM and moves the sample holder HL from the stage 13 of the observation chamber 10 to the stage 23 of the preprocessing chamber 20. In step S10, when desired observation is performed, the observation work ends. When the desired observation is not performed and, for example, the ion milling is insufficient, the process returns to step S6. After the preprocessing chamber 20 is vacuum-exhausted, the ion milling of the sample SAM is performed again.

In step S13, after the user returns the sample exchange rod 25 to the initial position, the control unit C5 closes the gate valve VL5 and the valve VL2. Then, the control unit C5 opens the leak valve VL7 and opens the preprocessing chamber 20 to the atmospheric pressure. Thereafter, the sample holder HL holding the sample SAM is taken out from the preprocessing chamber 20 via the conveyance port 26.

Then, the analysis method (analysis means) for the sample SAM ends.

Although the present invention has been specifically described based on the foregoing embodiments, the present invention is not limited to the foregoing embodiments and various modifications can be made within the scope without departing from the gist of the present invention.

REFERENCE SIGNS LIST

1: charged particle beam device
10: observation chamber
11: body tube
12: electron source
13: stage
14: vacuum gauge
15: condenser lens
16: objective lens
20: preprocessing chamber
20A to 20C first to third units
21: body tube
22: ion source
23: stage
24: vacuum gauge
25: sample exchange rod
26: conveyance port
31 to 34: exhaust pipes
31*a* to 34*a*: intake ports

31*b* to 34*b*: exhaust ports
40: high vacuum pump (vacuum pump, turbomolecular pump)
41: roughing pump (vacuum pump, dry pump)
50: input device
51: monitor
52: GUI screen
C0: controller
C1 to C7: control unit
EB: electron beam
HL: holder
IB: ion beam
SAM: sample
VL1 to VL4: valves
VL5: gate valve
VL6, VL7: leak valve

The invention claimed is:

1. A charged particle beam device comprising:
an observation chamber including a first exhaust port;
a first body tube mounted on the observation chamber;
a first charged particle source provided inside the first body tube and capable of radiating a first charged particle beam;
a first stage which is provided below the first charged particle source inside the observation chamber and in which a sample holder holding a sample is installable;
a preprocessing chamber connected to the observation chamber via a gate valve and including a second exhaust port;
a second body tube mounted on the preprocessing chamber;
a second charged particle source provided inside the second body tube and capable of radiating a second charged particle beam;
a second stage which is provided below the second charged particle source inside the preprocessing chamber and in which the sample holder holding the sample is installable;
a first vacuum pump including a first intake port and a second intake port;
a first exhaust pipe connected to the first intake port and the first exhaust port;
a second exhaust pipe connected to the second intake port and the second exhaust port;
a first valve provided halfway in the first exhaust pipe;
a second valve provided halfway in the second exhaust pipe; and
a controller configured to control an operation of each of the first charged particle source, the first stage, the second charged particle source, and the second stage, control driving of the first vacuum pump, and control open and closed states of the gate valve, the first valve and the second valve;
wherein a caliber of each of the first intake port and the first exhaust port is larger than a caliber of each of the second intake port and the second exhaust port, and
wherein the controller, when the sample holder holding the sample is installed on the second stage, is configured to control:
raising a degree of vacuum of each of the observation chamber and the preprocessing chamber by opening the gate valve, opening the first valve, closing the second valve, and driving the first vacuum pump;
closing the gate valve and opening the second valve after the driving of the first vacuum pump; and
processing the sample by radiating the second charged particle beam from the second charged particle source to the sample while performing vacuum exhaust of the preprocessing chamber by the first vacuum pump after the opening of the second valve.

2. The charged particle beam device according to claim 1, further comprising:

a third exhaust port provided in the preprocessing chamber;

a second vacuum pump including a third intake port and having an attainable degree of vacuum lower than the first vacuum pump;

a third exhaust pipe connected to the third intake port and the third exhaust port; and a third valve provided halfway in the third exhaust pipe, wherein the controller controls driving of the second vacuum pump and controls open and closed states of the third valve, wherein the controller is further configured to control raising the degree of vacuum of the preprocessing chamber by closing the gate valve, opening the first valve, closing the second valve, opening the third valve, and driving the second vacuum pump before raising the degree of vacuum, wherein the raising the degree of vacuum of each of the observation chamber and the preprocessing chamber by opening the gate valve, opening the first valve, closing the second valve, and driving the first vacuum pump are performed in a state where the third valve is in a closed state, and wherein, in the state where the third valve is in the closed state, the degree of vacuum of each of the observation chamber and the preprocessing chamber is greater than the degree of vacuum obtained by closing the gate valve, opening the first valve, closing the second valve, opening the third valve, and driving the second vacuum pump.

3. The charged particle beam device according to claim 2, further comprising a sample exchange rod provided inside the preprocessing chamber and used to move the sample holder between the observation chamber and the preprocessing chamber, wherein the controller is further configured to control:

opening the gate valve after the processing of the sample by radiating the second charged particle beam from the second charged particle source to the sample;

moving the sample holder holding the sample from the second stage to the first stage through an operation of the sample exchange rod by a user after the opening of the gate valve step (e);

closing the gate valve after the moving of the sample holder step (f); and observing the sample by radiating the first charged particle beam from the first charged particle source to the sample while performing vacuum exhaust of the observation chamber by the first vacuum pump after the closing of the gate valve.

4. The charged particle beam device according to claim 3, wherein the preprocessing chamber includes a first unit, a second unit, and a third unit that are detachably mountable each other, wherein, in the first unit, the second body tube, the second charged particle source, the second stage, and the second exhaust port are provided, wherein, in the second unit, the gate valve and the third exhaust port are provided, and wherein, in the third unit, the sample exchange rod is provided.

5. The charged particle beam device according to claim 3, further comprising:

a fourth exhaust port provided in the first vacuum pump;

a fourth intake port provided in the second vacuum pump;

a fourth exhaust pipe connected to the fourth intake port and the fourth exhaust port; and a fourth valve provided halfway in the fourth exhaust pipe, wherein the controller controls open and closed states of the fourth valve, and wherein the fourth valve is in a closed state during the raising the degree of vacuum of the preprocessing chamber by closing the gate valve, opening the first valve, closing the second valve, opening the third valve, and driving the second vacuum pump.

6. The charged particle beam device according to claim 1, wherein the first charged particle source is an electron source, wherein the first charged particle beam is an electron beam, wherein the second charged particle source is an ion source, and wherein the second charged particle beam is an ion beam.

7. A charged particle beam device comprising:

an observation chamber;

a first body tube mounted on the observation chamber;

a first charged particle source provided inside the first body tube and capable of radiating a first charged particle beam;

a first stage which is provided below the first charged particle source inside the observation chamber and in which a sample holder holding a sample is installable;

a preprocessing chamber connected to the observation chamber via a gate valve; and a sample exchange rod provided inside the preprocessing chamber and used to move the sample holder between the observation chamber and the preprocessing chamber, wherein the preprocessing chamber includes a first unit and a second unit that are detachably mountable each other, wherein, in the first unit, the gate valve is provided, and wherein, in the second unit, the sample exchange rod is provided.

8. The charged particle beam device according to claim 7, further comprising:

a second body tube mounted on the preprocessing chamber;

a second charged particle source provided inside the second body tube and capable of radiating a second charged particle beam; and a second stage which is provided below the second charged particle source inside the preprocessing chamber and in which the sample holder holding the sample is installable, wherein the preprocessing chamber includes the first unit, the second unit, and a third unit that are detachably mountable each other, and wherein, in the first unit, the second body tube, the second charged particle source, and the second stage are provided.

9. The charged particle beam device according to claim 8, further comprising:

a first exhaust port provided in the observation chamber;

a second exhaust port provided in the first unit;

a first vacuum pump including a first intake port and a second intake port;

a first exhaust pipe connected to the first intake port and the first exhaust port;

a second exhaust pipe connected to the second intake port and the second exhaust port;

a first valve provided halfway in the first exhaust pipe; and a second valve provided halfway in the second exhaust pipe, wherein a caliber of each of the first intake port and the first exhaust port is larger than a caliber of each of the second intake port and the second exhaust port.

10. The charged particle beam device according to claim 9, further comprising:

a third exhaust port provided in the second unit;

a second vacuum pump including a third intake port and having an attainable degree of vacuum lower than the first vacuum pump;

a third exhaust pipe connected to the third intake port and the third exhaust port; and a third valve provided halfway in the third exhaust pipe.

11. The charged particle beam device according to claim 8, wherein the first charged particle source is an electron source, wherein the first charged particle beam is an electron beam, wherein the second charged particle source is an ion source, and wherein the second charged particle beam is an ion beam.

12. A sample analysis method performed using a charged particle beam device including:

an observation chamber including a first exhaust port;

a first body tube mounted on the observation chamber;

a first charged particle source provided inside the first body tube and capable of radiating a first charged particle beam;

a first stage which is provided below the first charged particle source inside the observation chamber and in which a sample holder holding a sample is installable;

a preprocessing chamber connected to the observation chamber via a gate valve and including a second exhaust port and a third exhaust port;

a second body tube mounted on the preprocessing chamber;

a second charged particle source provided inside the second body tube and capable of radiating a second charged particle beam;

a second stage which is provided below the second charged particle source inside the preprocessing chamber and in which the sample holder holding the sample is installable;

a sample exchange rod provided inside the preprocessing chamber and used to move the sample holder between the observation chamber and the preprocessing chamber;

a first vacuum pump including a first intake port and a second intake port;

a second vacuum pump including a third intake port and having an attainable degree of vacuum lower than the first vacuum pump;

a first exhaust pipe connected to the first intake port and the first exhaust port;

a second exhaust pipe connected to the second intake port and the second exhaust port;

a third exhaust pipe connected to the third intake port and the third exhaust port;

a first valve provided halfway in the first exhaust pipe;

a second valve provided halfway in the second exhaust pipe; and a third valve provided halfway in the third exhaust pipe, the method comprising:

a step (a) of installing the sample holder holding the sample on the second stage;

a step (b) of raising the degree of vacuum of each of the observation chamber and the preprocessing chamber by closing the gate valve, opening the first valve, closing the second valve, opening the third valve, and driving the second vacuum pump after the step (a);

a step (c) of causing the degree of vacuum of the preprocessing chamber to be greater than the degree of vacuum in the step (b) by opening the gate valve, closing the third valve, and driving the first vacuum pump after the step (b);

a step (d) of closing the gate valve and opening the second valve after the step (c);

a step (e) of processing the sample by radiating the second charged particle beam from the second charged particle source to the sample while performing vacuum exhaust of the preprocessing chamber by the first vacuum pump after the step (d);

a step (f) of opening the gate valve after the step (e);

a step (g) of moving the sample holder holding the sample from the second stage to the first stage using the sample exchange rod after the step (f);

a step (h) of closing the gate valve after the step (g); and a step (i) of observing the sample by radiating the first charged particle beam from the first charged particle source to the sample while performing vacuum exhaust of the observation chamber by the first vacuum pump after the step (h), wherein a caliber of each of the first intake port and the first exhaust port is larger than a caliber of each of the second intake port and the second exhaust port.

13. The sample analysis method according to claim 12, wherein the first charged particle source is an electron source, wherein the first charged particle beam is an electron beam, wherein the second charged particle source is an ion source, and wherein the second charged particle beam is an ion beam.

* * * * *